United States Patent
Beatty et al.

(10) Patent No.: US 7,619,410 B2
(45) Date of Patent: Nov. 17, 2009

(54) SYSTEM AND METHOD FOR ACCELERATED MAGNETIC RESONANCE PARALLEL IMAGING

(75) Inventors: Philip James Beatty, Menlo Park, CA (US); Anja C. S. Brau, Menlo Park, CA (US)

(73) Assignees: General Electric Company, Schenectady, NY (US); Board of Trustees of Leland Stanford, Jr. University, Palo Alto, CA (US)

( * ) Notice: Subject to any disclaimer, the term of this patent is extended or adjusted under 35 U.S.C. 154(b) by 61 days.

(21) Appl. No.: 11/760,368

(22) Filed: Jun. 8, 2007

(65) Prior Publication Data

US 2008/0303521 A1    Dec. 11, 2008

(51) Int. Cl.
*G01V 3/00*    (2006.01)

(52) U.S. Cl. .................. 324/307; 324/309; 324/318

(58) Field of Classification Search ......... 324/300–322; 600/410–435
See application file for complete search history.

(56) References Cited

U.S. PATENT DOCUMENTS

| | | | | |
|---|---|---|---|---|
| 5,243,284 | A * | 9/1993 | Noll | 324/309 |
| 6,411,089 | B1 * | 6/2002 | Anand et al. | 324/309 |
| 6,597,936 | B1 * | 7/2003 | Liu et al. | 600/420 |
| 6,882,148 | B2 * | 4/2005 | Pipe | 324/307 |
| 7,023,207 | B1 * | 4/2006 | Gaddipati et al. | 324/309 |
| 7,030,609 | B2 * | 4/2006 | Pipe | 324/309 |
| 7,239,140 | B1 * | 7/2007 | Maier et al. | 324/318 |
| 7,265,547 | B2 * | 9/2007 | Vu | 324/309 |
| 7,309,984 | B2 * | 12/2007 | Arunachalam et al. | 324/307 |
| 7,382,127 | B2 * | 6/2008 | Gaddipati et al. | 324/309 |
| 7,397,242 | B2 * | 7/2008 | Samsonov et al. | 324/309 |
| 2006/0264735 | A1 * | 11/2006 | Stemmer | 600/410 |

OTHER PUBLICATIONS

Blaimer M, Barkauskas K, Kannengiesser S, Breuer F, Jakob PM, Duerk JL, Griswold MA, Artifact reduction in undersampled Blade/Propeller MRI by k-space extrapolation using parallel imaging, Proc. Intl. Soc. Mag. Reson. Med 14, 2006, #5.

Chuang T-C, Huang T-Y, Lin F-H, Wang F-N, Ko C-W, Kwong K. Chung H-W, Propeller EPI with parallel imaging on high resolution DTI at 3T, Proc. Intl. Soc. Mag. Reson. Med 13, 2005, #9.

Chuang T-C, Huang T-Y, Lin F-H, Wang F-N, Juan C-J, Chung H-W, Chen C-Y, Kwong KK, Propeller-EPI with parallel imaging using a circularly symmetric phased-array RF coil at 3.0T: application to high-resolution diffusion tensor imaging, Magn Reson Med 56:1352-1358, 2006.

* cited by examiner

*Primary Examiner*—Brij B Shrivastav
*Assistant Examiner*—Dixomara Vargas
(74) *Attorney, Agent, or Firm*—Ziolkowski Patent Solutions Group, SC

(57) ABSTRACT

A system and method for MR imaging includes the use of a form of autocalibrated parallel imaging. By combining a segmented, rotated acquisition trajectory with autocalibration parallel imaging (API), the system and method can achieve improved motion insensitivity while maintaining the benefits of accelerated acquisition due to parallel imaging. In various embodiments, calibration values from a set of reference data or from another set of imaging data can be used in determining reconstruction weights for a given k-space data set. Thus, separate calibration data need not necessarily be acquired for each set of imaging data.

21 Claims, 5 Drawing Sheets

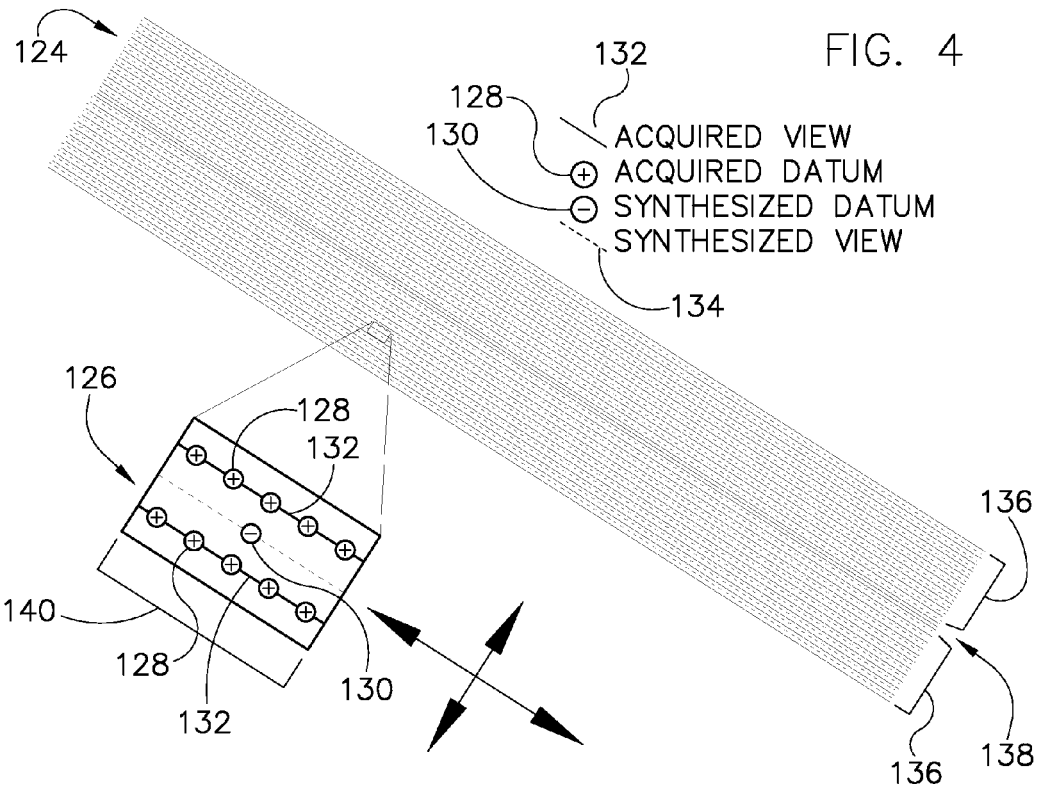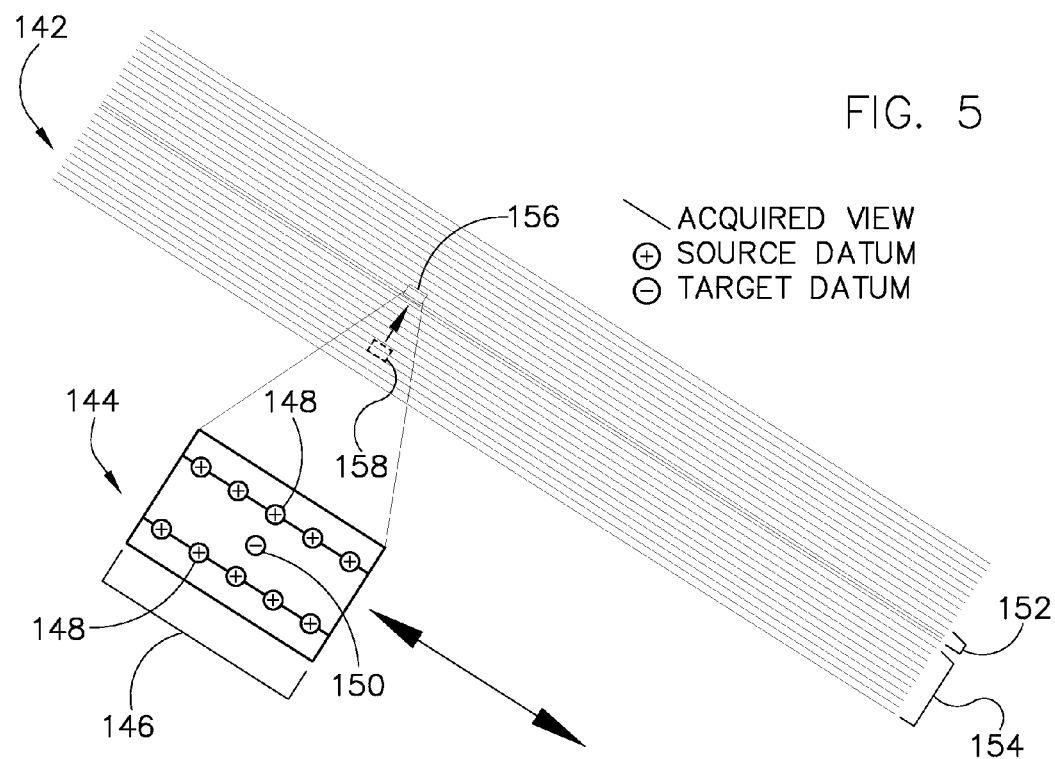

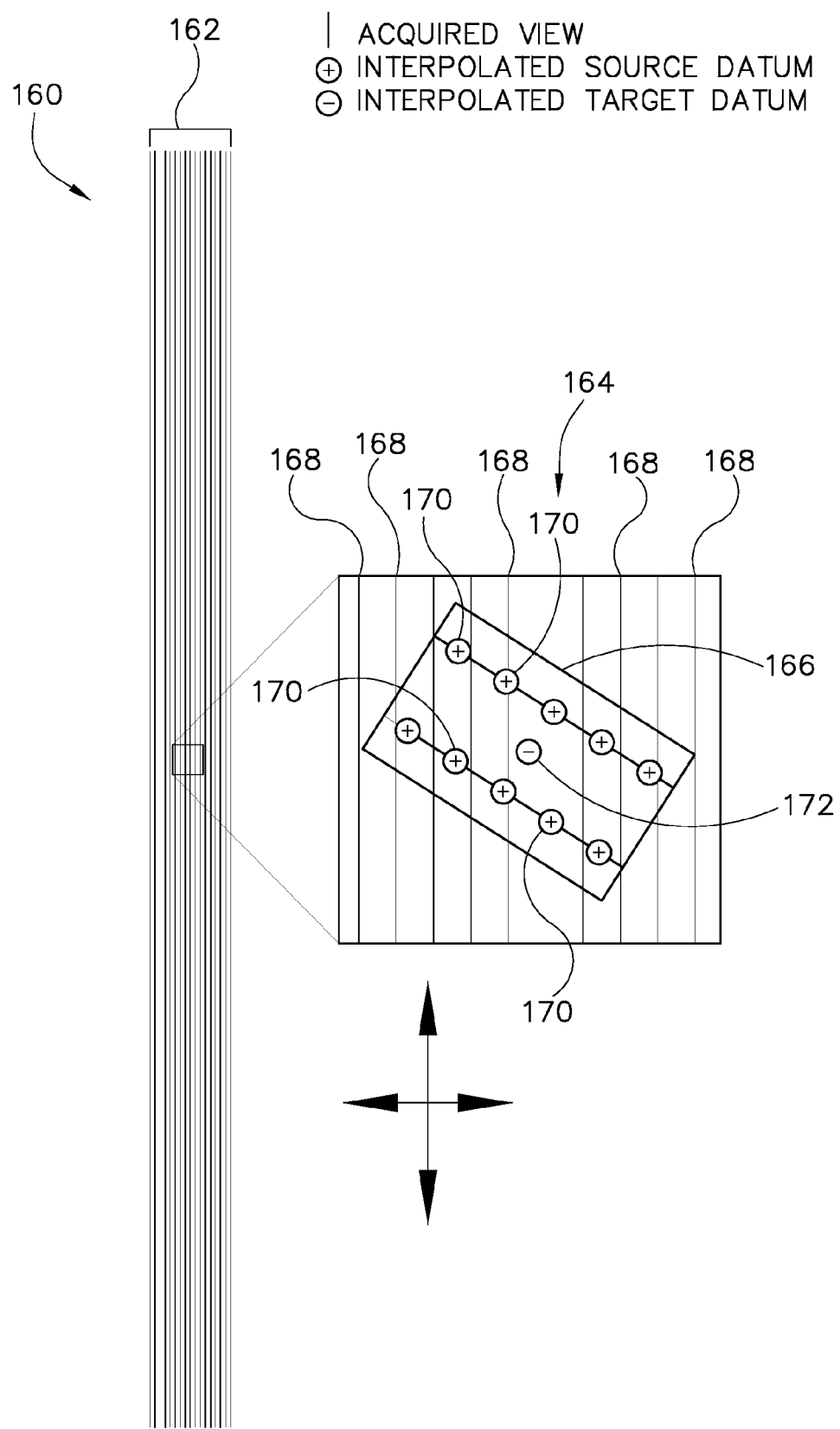

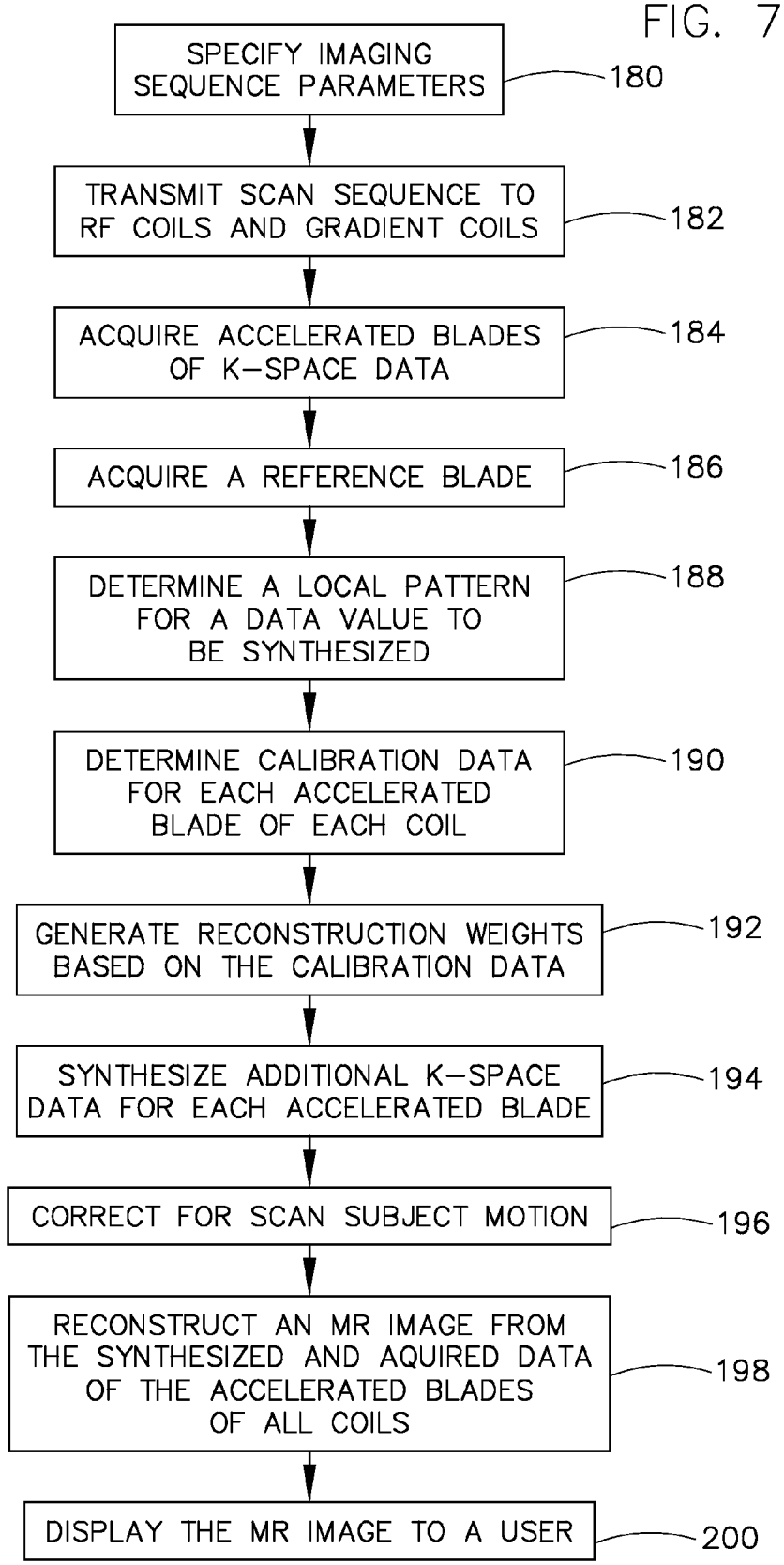

SYSTEM AND METHOD FOR ACCELERATED MAGNETIC RESONANCE PARALLEL IMAGING

BACKGROUND OF THE INVENTION

The present invention relates generally to magnetic resonance imaging, and, more particularly, to a system and method for parallel imaging with segmented, accelerated acquisition. Embodiments of the system and method may utilize segmented, rotated, and/or non-Cartesian k-space trajectories such as the Periodically Rotated Overlapping Parallel Lines with Enhanced Reconstruction (PROPELLER) technique to acquire multi-channel blades of k-space data. Oversampled "calibration" regions of the blades, or of a reference blade, may then be used to determine the parallel imaging reconstruction weights, used for synthesis of additional k-space data points.

MR imaging in general is based upon the principle of nuclear magnetic resonance. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

One technique for quickly acquiring a set of MR signals is parallel imaging. Broadly, parallel imaging utilizes an array of RF coils to each acquire a view of the scan subject. By simultaneously acquiring multiple channels of data, it is possible to increase the step size between phase-encoding lines, or equivalently to reduce the size of the field of view and the amount of data collected. In other words, scan time reduction is achieved by under-sampling k-space and recording k-space data simultaneously from the multiple imaging or receive coils. Under-sampling generally reduces the data acquisition time by increasing the distance of sampling positions in k-space.

Parallel imaging techniques not only expedite data acquisition, but also reduce aliasing or wrapping that occurs in the phase-encoding direction when an imaging object extends outside the reduced field-of-view (FOV). In particular, parallel imaging techniques remove or reduce the aliasing by using coil sensitivity maps or calibration data, to define or determine an unaliased spin distribution. Information regarding the coil $B_1$ sensitivities is typically acquired with an external calibration or a self-calibration technique. One method for parallel imaging using externally-generated sensitivity maps is known as SENSitivity Encoding (SENSE). An exemplary method for parallel imaging using self-calibration is known as GeneRalized Autocalibrating Partially Parallel Acquisition (GRAPPA). Generally, the coil sensitivity or calibration data is used to reduce aliasing in the reconstructed image that can occur as a result of under-sampling.

However, when certain imaging sequences are performed via a parallel imaging system, it can be difficult to achieve these undersampling or "acceleration" benefits. As an example, for the PROPELLER technique, in which k-space blades are acquired at various angles rotated about the k-space center, high net acceleration factors are presently not known to be implementable. While parallel imaging can shorten the echo train length, increase blade width, or reduce the number of acquired blades, these advantages are counterbalanced by several factors. In techniques which use externally-determined sensitivity data, it can be difficult and/or time-consuming to obtaining accurate sensitivity maps, especially where subject motion is an issue. In some instances, autocalibrating techniques can thus be more advantageous when motion insensitivity is a goal.

For autocalibrating techniques, however, the increase in scan time when separate calibration data is acquired for each blade can significantly reduce the net acceleration provided by parallel imaging. It would therefore be desirable to have a system and method capable of maintaining the acceleration benefits of parallel imaging while utilizing the motion insensitivity of segmented, rotated acquisition techniques like PROPELLER.

BRIEF DESCRIPTION OF THE INVENTION

Embodiments of the present invention provide a system and method for parallel imaging in which separate calibration data need not be acquired for each set of k-space data in a segmented k-space data acquisition. For example, a blade of k-space data may utilize calibration data acquired from another blade, to reduce total data acquisition and decrease scan time.

In accordance with one aspect of the invention, an MR imaging system includes a plurality of gradient coils positioned about a bore of a magnet and an RF transceiver, controlled by a pulse module, to transmit RF signals to an RF coils assembly. The RF coil assembly comprises a number of individual coil elements. The imaging system further includes a system control which receives MR signals detected by the RF coil assembly. The MR signals represent a number of k-space data which are rotated about the origin of k-space. The system control is programmed to generate reconstruction weights for at least one of the blades using calibration data from another blade and then reconstruct an MR image from the number of blades of k-space data using the reconstruction weights.

According to another aspect of the invention, a method for MR imaging includes acquiring a set of k-space data having an accelerated region and a calibration region and then rotating the acquisition plane to a new orientation. The data acquisition and acquisition plane rotation may be repeated for a desired number of acquisition plane orientations. The method also includes acquiring a reference set of k-space data. From a calibration region of a set of k-space data, the reference set of k-space data, or both, reconstruction weights are obtained. The method then includes reconstructing and displaying an MR image to a user.

In accordance with another aspect of the invention, a set of instructions is stored on a computer readable storage medium. The instructions, when executed, cause a computer to process blades of API k-space data, calculate a set of weights, synthesize additional data points, and store the data in memory for reconstruction. The computer calculates the weights using calibration data from a calibration region of at least one blade and synthesizes the additional data points for at least one of the blades of API k-space data using the set of weights.

Various other features and advantages of the present invention will be made apparent from the following detailed description and the drawings.

BRIEF DESCRIPTION OF THE DRAWINGS

The drawings illustrate embodiments presently contemplated for carrying out the invention.

In the drawings:

FIG. 4 is a concept view of a data synthesis technique for one blade of a k-space acquisition.

FIG. 5 is a concept view of one embodiment of a calibration data interpolation for one blade of a k-space acquisition.

FIG. 6 is a concept view of another embodiment of a calibration data interpolation for one blade of a k-space acquisition.

FIG. 7 is a flowchart setting forth a technique for across-blade calibration according to an embodiment of the invention.

DETAILED DESCRIPTION OF THE PREFERRED EMBODIMENT

Figure 1:
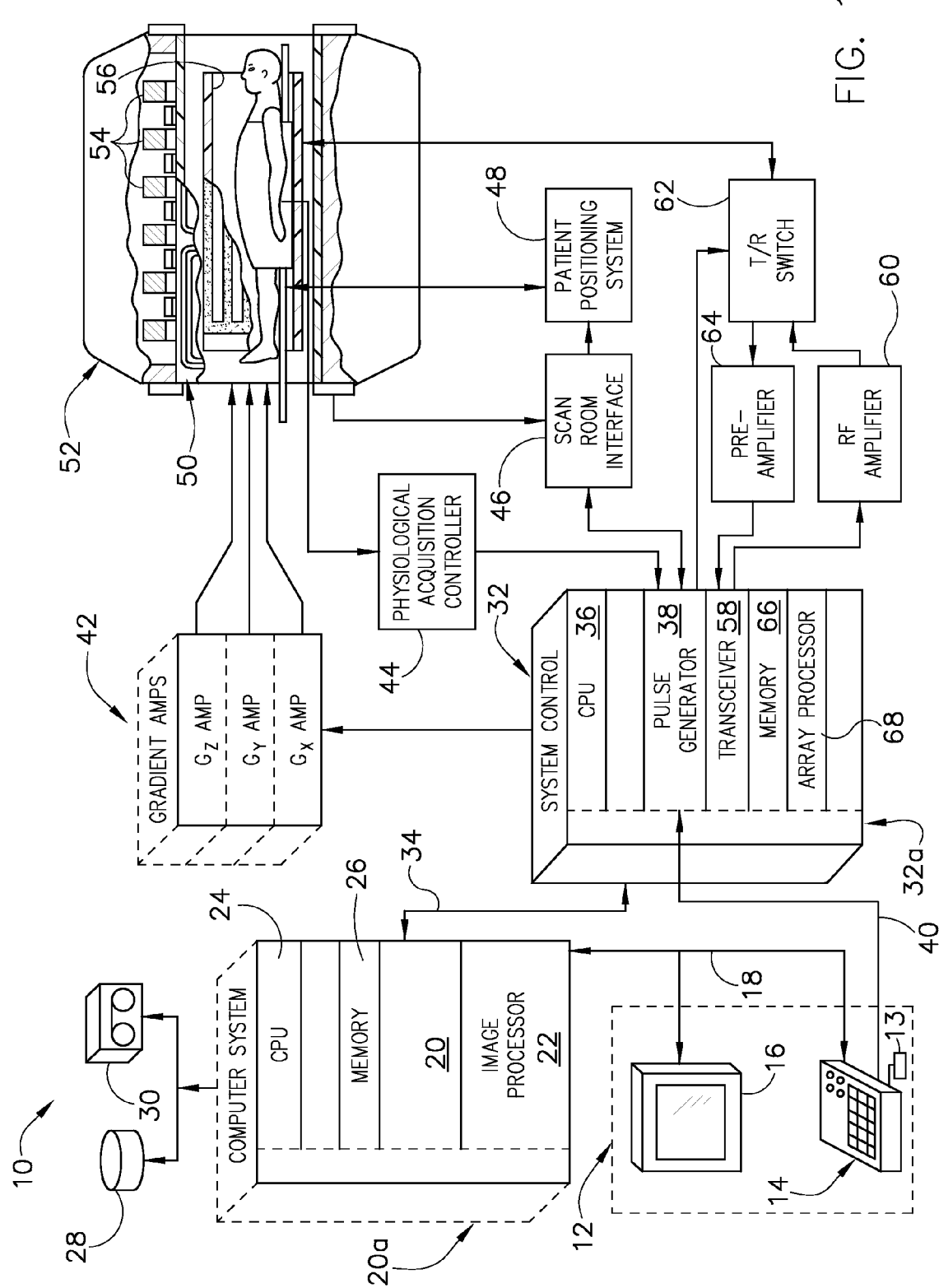
FIG. 1 is a schematic block diagram of an exemplary MR imaging system for use with an embodiment of the present invention.

Referring to FIG. 1, the major components of a preferred magnetic resonance imaging (MRI) system 10 incorporating an embodiment of the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
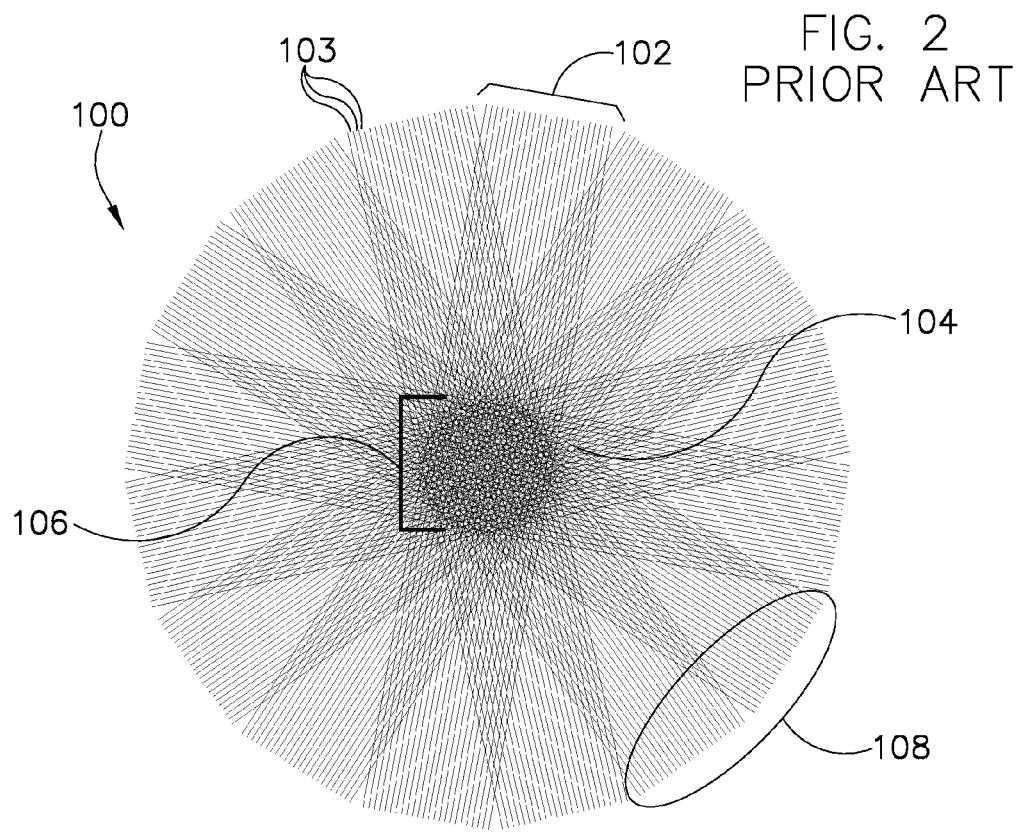
FIG. 2 is an exemplary k-space acquisition diagram for a PROPELLER technique.

Referring now to FIG. 2, a k-space acquisition pattern 100 for a common PROPELLER technique is shown. A number of sets of k-space data are acquired as blades 102. Each blade 102 has a number of phase encode lines 103 and is oriented differently from the other blades. In other words, during imaging, the plane of acquisition is rotated about the center 104 of the k-space between the acquisition of each blade 102. This results in a more dense sampling 106 near the center 104 of k-space compared to the periphery 108 of k-space, due to overlap. Additionally, because acquisition is segmented such that each blade 102 acquires the center 104 at a different time, the PROPELLER technique allows for motion correction. That is, by being able to compare commonly acquired data points, such as the center 104, PROPELLER presents an insensitivity to motion which is improved over that of other acquisition techniques.

Figure 3:
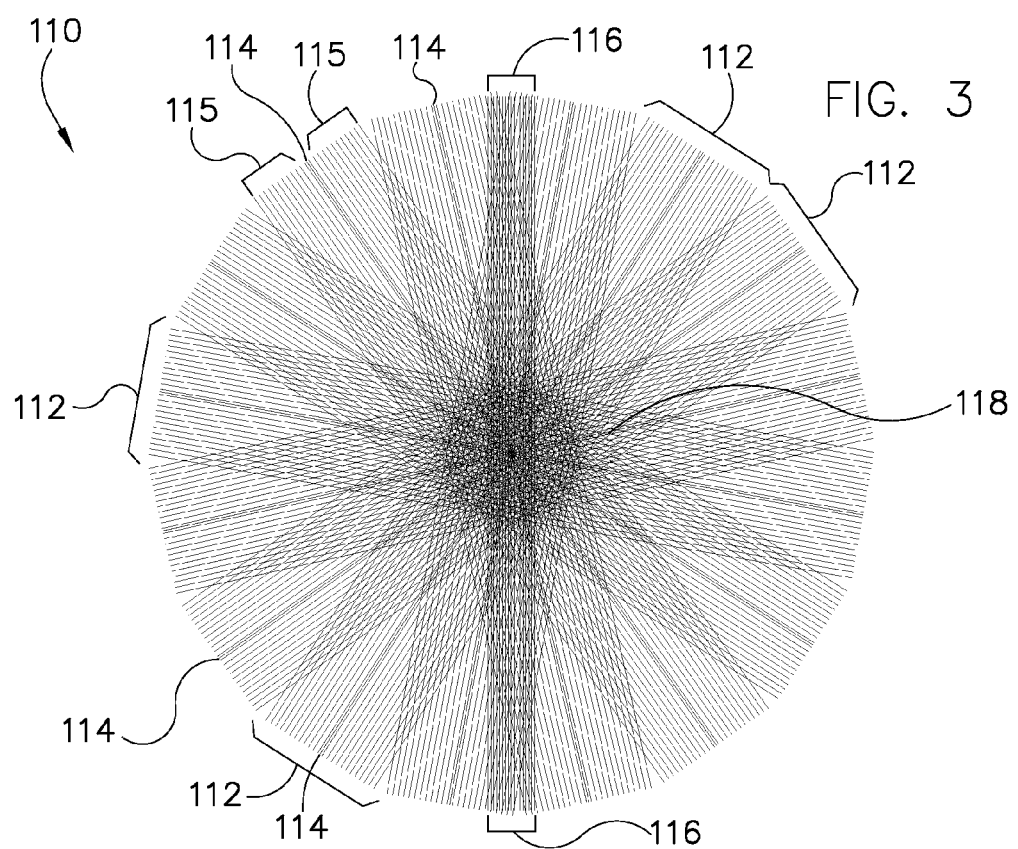
FIG. 3 is an exemplary k-space acquisition diagram according to one embodiment of the present invention.

FIG. 3 depicts a k-space acquisition pattern 110 which may be used with one embodiment of an "across-blade" autocalibration technique. As can be seen, pattern 110 includes a number of blades 112 of k-space data, rotated about an origin of the k-space 118. Additionally, it is to be understood that acquisition pattern 110 may be used in embodiments which acquire data via a parallel imaging technique (parallel transmit and/or parallel receive). That is, each coil element of a multi-channel RF coil assembly (not shown) may acquire the same acquisition pattern 110. Thus, k-space acquisition pattern 110 may be representative of a number of channels of data.

As shown, each blade of data 112, from each parallel channel of data, includes regions 115 having a number of lines of k-space data which are undersampled or "accelerated." Blades 112 also each have a "calibration" region 114 which includes a number of densely sampled or "oversampled" lines of k-space data. In other words, the lines of k-space data in undersampled regions 115 have greater phase encoding step values than the lines of k-space data in the oversampled regions 114. In practice, the blades 112 of k-space data may be acquired generally according to the PROPELLER technique. Additionally, acquisition pattern 110 may also include a calibration blade or "reference" blade 116. As shown, reference blade 116 occupies an orientation which is not necessary to the PROPELLER acquisition of blades 112. That is, reference blade 116 is acquired in addition to the PROPELLER acquisition, either before, after, or during the acquisition of blades 112. As shown, reference blade 116 includes only oversampled, calibration lines of k-space data.

However, as will be discussed below, it is understood that reference blade 116 may also include accelerated data lines and that accelerated blades 112 may include more or fewer oversampled lines 114. Additionally, the oversampled regions 114 of the accelerated blades 112 need not be located in the center of the accelerated blades 112, and reference blade 116 need not be oriented independently of the PROPELLER scheme. That is, a reference blade 116 may be oriented such that it is a part of the regular angular distribution of the PROPELLER blades 112. In other embodiments, reference blade 116 may be unnecessary. As will be made apparent, other orientations and locations of all the blades, the accelerated regions, and the calibration regions are possible.

For example, in the embodiment shown in FIG. 3, an acquisition pattern 110 might include nine total blades: eight accelerated blades 112 comprising a PROPELLER scheme and one blade being a reference or calibration blade 116. Where an echo train length (ETL) of each blade is 25 and a desired FOV or resolution (i.e. matrix size) is 256, reference blade 116 may have phase encoding steps designed to oversample the FOV by a factor of 1.5× while the eight accelerated blades 112 may be spaced to undersample the FOV by a factor of 2× while having one additional "calibration" phase encoding to create an oversampled region 114.

In another embodiment (not shown) an acquisition pattern might have only eight total blades, each having a nominal 40 phase encode lines. One blade may have 20 central "calibration" lines which oversample the FOV by a factor of 1.5× and an acceleration factor of 2× for the remaining lines. The result would be 34 total lines of k-space data and a net acceleration factor for this blade of 1.2×. The remaining seven blades could then be acquired with no central calibration region and no calibration lines at all. Rather, these seven blades could merely have acceleration factors of 2×, resulting in 20 phase encoding lines for each of the seven blades. The overall net acceleration factor for such an embodiment would be 1.8×.

FIG. 4 is a diagram of one accelerated blade 124 of k-space data with a section 126 thereof in an expanded view. As suggested with respect to FIG. 3, the accelerated blade 124 has accelerated regions 136 bracketing an oversampled region 138. After MR signals representing a set of blades of k-space data have been acquired from a number of RF coil elements (not shown), an MR system, such as MR system 10 of FIG. 1, will begin an image reconstruction phase. To avoid aliasing and other artifacts caused by the undersampling intrinsic to accelerated parallel imaging techniques, image data values for each blade are synthesized. In some reconstruction techniques, enough data is synthesized to reach a critical or Nyquist threshold. In the expanded view 126 of the blade 124 shown in FIG. 4, actual acquired data values 128 are distinguished from a data value 130 to be synthesized. Similarly, actual acquired views 132 are distinguished from views to be synthesized 134 to reach the desired level of data points for proper image reconstruction.

To find the desired synthesized data point 130, a set of reconstruction weights are utilized in a synthesis phase. For an autocalibration technique, the reconstruction weights may be obtained from calibration data of an oversampled region, such as oversampled region 138 of blade 124. However, in accordance with an aspect of the invention, blades 124 may be acquired with less calibration data (i.e. a smaller oversampled region) than would typically be acquired for acceptable image quality. That is, if calibration data from only a small oversampled region 138 were used to obtain reconstruction weights, image artifacts would likely result. If oversampled region 138 were larger, thereby having more calibration data, image artifacts could be avoided.

The expanded portion 126 of blade 124 illustrates a pattern 140 of acquired data points 128 surrounding the to-be-synthesized data point 130. This pattern 140 can be used in a local projection calibration technique to find reconstruction weights. That is, the pattern 140 can be applied to synthesize or interpolate calibration data points (not shown), which, in turn, can be used to determine reconstruction weights. The determined reconstruction weights may then be applied in the synthesis of the image data value 130. It is to be understood that an "interpolation" and a "synthesis" of datum may be similar or identical operations. However, for purposes of convention and without limiting effect, the determination of a calibration data point from local pattern data will be referred to herein as an "interpolation," and the determination of an imaging data value for image reconstruction will be referred to herein as a "synthesis."

In addition, the local projection calibration technique can be applied to allow for the calibration of one blade using data acquired in another blade. Using calibration data acquired in another blade to interpolate calibration data can be thought of as a shift in k-space. Since shifting in k-space does not affect the magnitude of an image-space vector, the same set of weights which minimize the magnitude of error in a shifted k-space dataset will minimize the magnitude of the error in the original k-space dataset. For example, applying pattern 140 in another region of k-space outside blade 124 to interpolate a calibration data value will still allow for the determination of appropriate reconstruction weights. In general, a pattern can be defined by the following:

$$P(k,k')=\{(j,k'+\Delta k)|(j,k+\Delta k)\epsilon L(k)\} \qquad \text{Eqn. 1,}$$

where k is the original k-space location, k' is the shifted k-space location, $\Delta k$ is the size or area of the pattern, and j represents the number of independent channels of data from the parallel coils. $L(k)$ is the local set of data values acquired from all coils at the k' location which fall within the radius of the pattern, $\Delta k$.

Referring now to FIG. 5, a concept view is shown in which a pattern 146 is used to determine a target calibration data value 150 from a calibration region 152 of an accelerated blade 142. In one implementation, blade 142 may be the same blade 124 (FIG. 4) from which the pattern 146 was obtained. Thus, pattern 146 may be shifted from a first k location 158 in the undersampled region 154 to a second k' or "fit" location 156 within the calibration region 152. Alternatively, blade 142 may be a different blade from the blade 124 from which the pattern 146 was obtained. That is, calibration data for one blade may be determined from other blades of an acquisition sequence.

As shown in the expanded view 144, pattern 146 has an arrangement of acquired data values 148 surrounding a target calibration data point 150. This pattern 146 is proportionate to the pattern 140 identified in FIG. 4. Pattern 146 of FIG. 5 has been shifted to a new k-space location 156, but has not been rotated or resized. Depending upon the degree of oversampling in calibration region 152, the pattern 146 may align such that the target calibration data point 150 of pattern 146 falls on an actually acquired data value. Alternatively, if the target calibration data point 150 does not directly align with an actually acquired data value of blade 142, a local region interpolation may be used to find the projected value at the target calibration data point location 150 of pattern 146.

To obtain a sufficient number of calibration data points 150 for reconstruction weight calculation, pattern 146 may be shifted throughout the calibration region 152 to a plurality of k' fit locations in the k-space datasets acquired by each coil for a given blade 124. For example, one implementation might slide pattern 146 along calibration region 152 for 250 distinct k' locations. In a general matrix form, the effect of positioning pattern 146, having N acquired data points, in M fit locations within a calibration region of J coils can be described as:

$$\begin{bmatrix} d_{111} & \cdots & d_{1N1} & \cdots & d_{J11} & \cdots & d_{JN1} \\ & & & \cdots & & & \\ d_{11M} & \cdots & d_{1NM} & \cdots & d_{J1M} & \cdots & d_{JNM} \end{bmatrix} \begin{bmatrix} w_{111} & \cdots & w_{11J} \\ w_{121} & & w_{12J} \\ \cdots & & \cdots \\ w_{JN1} & \cdots & w_{JNJ} \end{bmatrix} \approx \begin{bmatrix} c_{11} & \cdots & c_{J1} \\ \cdots & & \cdots \\ c_{1M} & \cdots & c_{JM} \end{bmatrix}, \quad \text{Eqn. 2}$$

where the rows of the first term are the acquired data values 1–N for each coil 1–J for fit locations 1–M, the columns of the second term are the reconstruction weights for each coil 1–J, and the columns of the third term are the calibration data values determined for each coil 1–J for each fit location 1–M. For the embodiment shown in FIG. 5, the acquired data values for a given fit location fill a row of d values and the calibration data value 150 acquired for that fit location fills a corresponding position in a column of c values. Thus, for the embodiment of FIG. 5, the d and c values will be known, and no interpolation steps will be necessary. Combining and simplifying Eqn. 1 and Eqn. 2, the weights w can be defined as:

$$w_{j,L(k)}^T(k) = [d_j(k'_1) \ldots d_j(k'_{N_R})][d_{P(k,k'_1)} \ldots d_{P(k,k'_{N_R})}]^\dagger \quad \text{Eqn. 3.}$$

Referring to FIG. 6, another implementation is shown in which a reference blade 160 is used instead of, or in combination with, a calibration region of an accelerated blade (not shown) to generate reconstruction weights. As shown, reference blade 160 includes only oversampled k-space data 162. It is to be understood, however, that reference blade 160 may also include critically-sampled, or undersampled regions (not shown) as well. In the expanded section 164, a pattern 166 has been overlaid onto the reference blade 160. For purposes of explanation, pattern 166 is shown as the pattern 140 from the k-space blade 124 of FIG. 4. The acquired data points 170 and the calibration data point 172 of pattern 166 in FIG. 6, however, do not directly align with the acquired data 168 of the reference blade. That is, the acquired views 168 of k-space data of reference blade 160 may not directly provide data values to fill the pattern of acquired data points 170 or the calibration point 172.

In some embodiments, it may be acceptable to utilize actual data points of the acquired views 168 of reference blade 160 to fill in the data points 170 of the pattern 166. In such a case, the nearest acquired data point 168 of the reference blade 160 could be used to fill data points 170 of pattern 166 to find calibration point 172. Alternatively, other embodiments may achieve a more accurate set of reconstruction weights using interpolation. Each data point 170 of pattern 166 could be interpolated or averaged from a set of nearby acquired data points of the views 168 of reference blade 160. Calibration data point 172 can also be interpolated from the acquired data in views 168. These types of interpolations may be performed, for example, through various gridding techniques such as by using a Kaiser-Bessel gridding kernel. The calibration data points 172 so acquired at a number of fit locations can then be used instead of, or in combination with, calibration data determined from a given k-space blade to find reconstruction weights as discussed above. For example, in Eqn. 2, the rows of local pattern set d values in the first matrix term may be supplemented or replaced with rows of interpolated d' values obtained from another blade or from multiple other blades. Likewise, the columns of calibration values c in the third matrix term may be supplemented or replaced with columns of interpolated c' values obtained from another blade or multiple other blades.

More specifically, the acquired data 168 of a reference blade can be used in the first term of Eqn. 2 to supplement or replace data values from other blades. The interpolated calibration values obtained from the reference blade can also be used, in the third term of Eqn. 2. Additionally, it is understood that better reconstruction weights may result if all acquired data values in each row of the first term of Eqn. 2 are either all actual data values or all interpolated data values. It will be recognized by one skilled in the art that Eqns. 1-3 are representative of local projection calibrations from an Anti-aliasing Partially Parallel Encoded Acquisition Reconstruction (APPEAR) parallel imaging technique. However, in the embodiments discussed herein, each blade of a segmented, rotated acquisition need not contain a sufficient amount of calibration data for each blade to self-calibrate. Using interpolation and local pattern projection across blades can reduce or eliminate the amount of calibration data acquired per blade and increase the overall acceleration factor of a scan.

Moreover, since a reference blade 160 can be acquired such that it passes through or near a center of k-space where lower spatial frequency data is found, the quality of reconstruction weights resulting from calibration data interpolation in the implementations and techniques discussed herein may be improved. Likewise, a calibration region of an accelerated blade may also be positioned to pass through or near the k-space center. Utilizing lower spatial frequency data in this manner to find calibration data is known as central region interpolation.

Referring now to FIG. 7, a flowchart is shown, illustrating one manner of implementing an autocalibrating parallel imaging (API) rotated-acquisition MR imaging sequence. At block 180 an MR system will input user-specifications regarding the imaging sequence to be performed. A user may identify a particular field of view, resolution, sequence type, desired SAR limits, echo train lengths, repetition times, flip angles, and the like. The system will then develop a scan sequence and transmit the waveforms to a multi-channel RF coil assembly and associated gradient coils for imaging at block 182. When the waveforms are played out, the MR system will acquire resulting MR signals which represent accelerated blades or rotated segments of k-space data at block 184. As discussed above, some embodiments of the invention will acquire the blades of data according to a PROPELLER technique. The number and acceleration factors of the blades may vary according to user specifications and/or image quality constraints. Also, the blades may optionally have calibration regions of various sizes and oversampling factors.

At block 186, the MR system may also optionally acquire a reference blade of calibration data. However, it is to be understood that a reference blade may not be strictly necessary where sufficient calibration regions are acquired in the accelerated blades. Conversely, where insufficient calibration regions or no calibration regions are acquired with the accelerated blades at block 184, then a reference blade may be used for interpolation of some or all of the calibration data.

Next, the MR system will determine a local pattern for a data value to be synthesized in an accelerated blade at block 188. Using the local pattern, the MR system will determine calibration data for each accelerated blade of each coil at block 190. That is, multiple channels of data will exist for each accelerated blade due to the use of a parallel coil array. Calibration for each channel of a given accelerated blade can be determined using calibration regions of the given blade itself, of other accelerated blades, of the reference blade, or of any combination thereof. The number of fit locations used to obtain calibration data may be roughly proportional the extent of aliasing and/or artifacts in the resulting image. Moreover, calibration data may be determined directly as acquired data values from a blade, or may be interpolated from data values filling the pattern set.

Once a desired amount of calibration data has been obtained, the MR system can generate a set of reconstruction weights at block 192. Using the reconstruction weights, additional data values for each accelerated k-space blade can be synthesized at block 194. The amount of data which is synthesized can be determined according to a desired resolution or according to a critical sampling rate or Nyquist rate. Once each blade for each coil has been supplemented with additional synthesized data, a motion correction technique may be employed at block 196 to take advantage of the relative motion insensitivity of a rotated, segmented acquisition scheme. For example, motion corrections usually associated with the PROPELLER technique may be used. From the supplemented accelerated k-space blades, an MR image can be reconstructed at block 198 and ultimately displayed to a user at block 200.

Accordingly, it has been shown that an "across-blade calibration" technique for implementing an API PROPELLER type imaging sequence can provide for improved acceleration factors and better image quality. By using calibration regions of other PROPELLER blades or of a reference blade to obtain reconstruction weights, the extent of total calibration region acquisition within a single blade can be reduced. A technical contribution for computer-based implementations of the disclosed method and apparatus is the ability to produce MR images using reconstruction weights determined from calibration data obtained in any calibration region of an acquisition.

Therefore, one embodiment of the invention includes an MR imaging system having a plurality of gradient coils, an RF transceiver, and a system control. The gradient coils are positioned about a bore of a magnet to operate in conjunction with an RF coil assembly having a number of individual coil elements. The RF transceiver is controlled by a pulse module to transmit RF signals to the RF coil assembly. The system control is programmed to receive MR signals, detected by the RF coil assembly, which represent blades of k-space data rotated about an origin of k-space. The system control is further programmed to then generate a set of reconstruction weights for at least one of the blades using calibration data from at least one other blade. Using the reconstruction weights, the system control reconstructs an MR image from the blades of k-space data.

According to another embodiment of the invention, a method for MR imaging is provided. The method includes acquiring a number of sets of k-space data, each having an accelerated region and a calibration region and each set having an orientation representing a rotated acquisition plane. The method further includes acquiring a reference set of k-space data and obtaining reconstruction weights using data from a calibration region of a k-space data set, the reference set, or both. An MR image may then be reconstructed and displayed to a user.

In another embodiment of the invention, a set of instructions are stored on a computer readable storage medium which, when executed by the computer, cause the computer to process a plurality of blades of autocalibrating parallel image (API) k-space data. Using the calibration data form a calibration region of a blade, the computer is caused to calculate a set of weights and synthesize additional data points for a blade using the set of weights. The computer is then caused to store the plurality of blades and the additional synthesized data points in memory for image reconstruction.

The present invention has been described in terms of the preferred embodiment, and it is recognized that equivalents, alternatives, and modifications, aside from those expressly stated, are possible and within the scope of the appending claims.

What is claimed is:

1. A magnetic resonance (MR) imaging system comprising:
   a plurality of gradient coils positioned about a bore of a magnet;
   an RF transceiver controlled by a pulse module to transmit RF signals to an RF coil assembly having a number of individual coil elements;
   a system control programmed to:
      receive MR signals detected by the RF coil assembly, the MR signals representing a number of blades of k-space data rotated about an origin of k-space;
      generate a set of reconstruction weights for at least one of the number of blades using calibration data from at least one other blade;
      synthesize additional data points for the at least one of the number of blades using the set of reconstruction weights; and
      reconstruct an MR image from the number of blades of k-space data using the set of reconstruction weights.

2. The MR imaging system of claim 1 wherein the system control is further programmed to cause the plurality of gradient coils and the RF coil assembly to transmit a pulse sequence to acquire the MR signals according to a PROPELLER technique.

3. The MR imaging system of claim 1 wherein the number of blades of k-space data comprise undersampled portions and oversampled portions.

4. The MR imaging system of claim 3 wherein the system control is further programmed to generate the set of reconstruction weights for the at least one of the number of blades using calibration data determined from oversampled portions of at least two of the number of blades.

5. The MR imaging system of claim 1 wherein the system control is further programmed to cause acquisition of an oversampled reference blade.

6. The MR imaging system of claim 5 wherein the at least one other blade is the oversampled reference blade.

7. The MR imaging system of claim 6 wherein the blades of k-space data are accelerated blades of k-space data, free of calibration regions.

8. The MR imaging system of claim 1 wherein the system control is further programmed to interpolate the calibration data according to a local projection calibration technique.

9. A method for MR imaging comprising:
  (A) acquiring a set of k-space data having an accelerated region and a calibration region;
  (B) rotating a plane of acquisition to a new orientation;
  (C) repeating steps (A) and (B) for a desired number of acquisition plane orientations;
  (D) acquiring a reference set of k-space data;
  (E) obtaining reconstruction weights for each set of k-space data acquired in step (A) using data from at least one of a calibration region and the reference set, wherein obtaining the reconstruction weights further includes interpolating calibration data points for each set of k-space data acquired in step (A); and
  (F) reconstructing and displaying an MR image to a user.

10. The method of claim 9 wherein interpolating the calibration data points for a given set of k-space data acquired in step (A) includes using at least one of data from the calibration region of the given set of k-space data, data from the calibration region of another set of k-space data, and data from the reference set of k-space data.

11. The method of claim 9 further comprising performing steps (A)-(C) according to a PROPELLER technique and obtaining the set of reconstruction weights according to an APPEAR technique.

12. The method of claim 9 wherein obtaining the reconstruction weights includes determining a pattern set for a k-space data point to be synthesized and interpolating calibration data points for a given set of k-space data acquired from a given coil element according to the pattern set.

13. The method of claim 9 wherein the reference set of k-space data is an oversampled blade of k-space data.

14. A computer-readable storage medium having a set of instructions stored thereon which, when executed by a computer, cause the computer to:
  process a plurality of blades of autocalibrating parallel imaging (API) k-space data, each blade of API k-space data having a distinct orientation;
  calculate a set of weights using calibration data from a calibration region of at least one of the plurality of blades;
  synthesize a number of additional data points for each of the plurality of blades of API k-space data using the set of weights; and
  store the plurality of blades and the additional synthesized data points in memory for image reconstruction.

15. The computer-readable storage medium of claim 14 wherein the plurality of blades of API k-space data each include an accelerated region and a calibration region.

16. The computer-readable storage medium of claim 15 wherein the plurality of blades of API k-space data further includes at least one reference blade.

17. The computer-readable storage medium of claim 16 wherein the set of instructions further causes the computer to calculate the set of weights for a given blade of API k-space data from at least one of calibration data of another blade and calibration data of the at least one reference blade.

18. The computer-readable storage medium of claim 14 wherein the set of instructions further causes the computer to interpolate calibration data for each channel of data of each blade of API k-space data.

19. The computer-readable storage medium of claim 18 wherein the set of instructions further causes the computer to use a local projection technique to interpolate the calibration data for each channel of data of each blade of API k-space data.

20. A magnetic resonance (MR) imaging system comprising:
  a plurality of gradient coils positioned about a bore of a magnet;
  an RF transceiver controlled by a pulse module to transmit RF signals to an RF coil assembly having a number of individual coil elements;
  a system control programmed to:
    receive MR signals detected by the RF coil assembly, the MR signals representing a number of blades of k-space data rotated about an origin of k-space, wherein the number of blades of k-space data comprise undersampled portions and oversampled portions;
    generate a set of reconstruction weights for at least one of the number of blades using calibration data from at least one other blade; and
    reconstruct an MR image from the number of blades of k-space data using the set of reconstruction weights.

21. A magnetic resonance (MR) imaging system comprising:
  a plurality of gradient coils positioned about a bore of a magnet;
  an RF transceiver controlled by a pulse module to transmit RF signals to an RF coil assembly having a number of individual coil elements;
  a system control programmed to:
    receive MR signals detected by the RF coil assembly, the MR signals representing a number of blades of k-space data rotated about an origin of k-space;
    cause acquisition of an oversampled reference blade;
    generate a set of reconstruction weights for at least one of the number of blades using calibration data from at least one other blade; and
    reconstruct an MR image from the number of blades of k-space data using the set of reconstruction weights.

* * * * *

UNITED STATES PATENT AND TRADEMARK OFFICE
CERTIFICATE OF CORRECTION

PATENT NO. : 7,619,410 B2  Page 1 of 1
APPLICATION NO. : 11/760368
DATED : November 17, 2009
INVENTOR(S) : Beatty et al.

It is certified that error appears in the above-identified patent and that said Letters Patent is hereby corrected as shown below:

Col. 1, line 5, insert the following statement:

--GOVERNMENT LICENSE RIGHTS

This invention was made with Government support under contracts HL039297 and HL075803 awarded by the National Institutes of Health. The Government has certain rights in this invention.--

Signed and Sealed this

Nineteenth Day of January, 2010

David J. Kappos
*Director of the United States Patent and Trademark Office*

UNITED STATES PATENT AND TRADEMARK OFFICE
CERTIFICATE OF CORRECTION

PATENT NO. : 7,619,410 B2
APPLICATION NO. : 11/760368
DATED : November 17, 2009
INVENTOR(S) : Beatty et al.

It is certified that error appears in the above-identified patent and that said Letters Patent is hereby corrected as shown below:

In the Specifications:

Col. 1, line 5, insert the following statement:

-- FEDERALLY-SPONSORED RESEARCH OR DEVELOPMENT

This invention was made with Government support under contracts HL039297 and HL075803 awarded by the National Institutes of Health. The Government has certain rights in this invention. --

This certificate supersedes the Certificate of Correction issued January 19, 2010.

Signed and Sealed this
Twenty-first Day of May, 2013

Teresa Stanek Rea
*Acting Director of the United States Patent and Trademark Office*